US009386673B2

(12) United States Patent
Sumi et al.

(10) Patent No.: US 9,386,673 B2
(45) Date of Patent: *Jul. 5, 2016

(54) ESD PROTECTION DEVICE AND METHOD FOR PRODUCING SAME

(71) Applicant: Murata Manufacturing Co., Ltd., Kyoto (JP)

(72) Inventors: Takahiro Sumi, Kyoto (JP); Jun Adachi, Kyoto (JP); Takayuki Tsukizawa, Kyoto (JP); Kumiko Hiehata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 348 days.

This patent is subject to a terminal disclaimer.

(21) Appl. No.: 14/154,720

(22) Filed: Jan. 14, 2014

(65) Prior Publication Data
US 2014/0126102 A1 May 8, 2014

Related U.S. Application Data

(63) Continuation of application No. PCT/JP2012/066820, filed on Jun. 30, 2012.

(30) Foreign Application Priority Data

Jul. 15, 2011 (JP) ................................. 2011-156189
Feb. 29, 2012 (JP) ................................. 2012-042737

(51) Int. Cl.
*H02H 9/00* (2006.01)
*H05F 3/04* (2006.01)
(Continued)

(52) U.S. Cl.
CPC .. *H05F 3/04* (2013.01); *H01T 1/22* (2013.01); *H01T 4/12* (2013.01); *H05K 1/026* (2013.01);
(Continued)

(58) Field of Classification Search
CPC ............... H02H 9/04; H05F 3/04; H05K 7/00
USPC ............................................................ 361/56
See application file for complete search history.

(56) References Cited

U.S. PATENT DOCUMENTS 8,238,069 B2   8/2012 Adachi
8,421,582 B2   4/2013 Hiehata
(Continued)

FOREIGN PATENT DOCUMENTS

CN   101933204 A   12/2010
JP   2008-085284 A   4/2008
(Continued)

OTHER PUBLICATIONS

Office Action issued in Chinese Patent Application No. 201280035128.0 dated Dec. 3, 2014.
(Continued)

*Primary Examiner* — Dharti Patel
(74) *Attorney, Agent, or Firm* — Pearne & Gordon LLP

(57) ABSTRACT

An ESD protection device providing highly reliable insulation and having good discharge characteristics is provided. An ESD protection device has opposing first and second discharge electrodes, an auxiliary discharge electrode (18) astride between the first and second discharge electrodes, and an insulating substrate (12) supporting the first and second discharge electrodes and the auxiliary discharge electrode (18). The auxiliary discharge electrode (18) is composed of an assembly of core-shell metal particles (24) that have a core portion (22) mainly composed of a first metal and a shell portion (23) mainly composed of a metal oxide that contains a second metal. The metal particles (24) are substantially completely covered with the shell portion (23) mainly composed of the metal oxide, and this improves the insulation reliability of the device against discharge. Preferably, the metal particles (24) have a bond with each other with a vitreous substance (27) therebetween.

17 Claims, 6 Drawing Sheets

(51) Int. Cl.
*H01T 4/12* (2006.01)
*H05K 7/00* (2006.01)
*H01T 1/22* (2006.01)
*H05K 1/02* (2006.01)
*H01L 23/60* (2006.01)

(52) U.S. Cl.
CPC . *H05K 7/00* (2013.01); *H01L 23/60* (2013.01); *H01L 2924/0002* (2013.01); *H05K 2201/09063* (2013.01)

(56) References Cited

U.S. PATENT DOCUMENTS

| | | | |
|---|---|---|---|
| 2011/0131976 A1 | 6/2011 | Kratschmer | |
| 2011/0222203 A1 | 9/2011 | Adachi | |
| 2014/0327993 A1* | 11/2014 | Sumi | H01T 1/20 361/56 |
| 2014/0340812 A1* | 11/2014 | Sumi | H01T 1/20 361/220 |

FOREIGN PATENT DOCUMENTS

| | | |
|---|---|---|
| JP | 2009-289839 A | 12/2009 |
| WO | 2009/098944 A1 | 8/2009 |
| WO | 2010/040437 A2 | 4/2010 |
| WO | 2010/061519 A1 | 6/2010 |
| WO | 2010/061550 A1 | 6/2010 |
| WO | 2011/040437 A1 | 4/2011 |

OTHER PUBLICATIONS

International Search Report for Application No. PCT/JP2012/066820 dated Sep. 11, 2012.

Written Opinion of the International Searching Authority for PCT/JP2012/066820 dated Sep. 11, 2012.

* cited by examiner

ESD PROTECTION DEVICE AND METHOD FOR PRODUCING SAME

BACKGROUND OF THE INVENTION

1. Field of the Invention

The present invention relates to an ESD (electrostatic discharge) protection device and a method for producing an ESD protection device. In particular, the present invention relates to the improvement of an auxiliary electrode that accelerates electrostatic discharge in ESD protection devices.

2. Description of the Related Art

Japanese Unexamined Patent Application Publication No. 2008-85284 (Patent Document 1) describes an overvoltage protection device interesting for the present invention.

The overvoltage protection device according to Patent Document 1, which is for use as auxiliary discharge electrode for accelerated discharge, is made of a material that contains a non-conductive powder (e.g., silicon carbide; 1 to 50 μm in particle diameter), a metal-based conductive powder (e.g., copper; 0.01 to 5 μm in particle diameter), and an adhesive agent (e.g., a glass powder).

Patent Document 1 also describes a method for producing an overvoltage protection device. The method comprises forming a material paste by uniformly mixing predetermined proportions of a non-conductive powder, a metal-based conductive powder, and an adhesive agent, printing the material paste on a substrate, and firing the substrate (temperature: 300° C. to 1200° C.).

The technologies described in Patent Document 1, however, have unresolved problems including the following.

First, the exposed surface of the metal-based conductive powder allows the conductive metal particles to be electrically coupled to each other during discharge, and this may affect the insulation reliability. The lowered insulation reliability cannot be easily improved because silicon carbide, i.e., the non-conductive powder, is a semiconductor and has a relatively low insulation resistance.

International Publication No. 2009/098944 (Patent Document 2) provides a potential solution to such problems.

Patent Document 2 mentions that a dispersion of a conductive material (e.g., a Cu powder) coated with an inorganic material (e.g., $Al_2O_3$) is used as an auxiliary discharge electrode. The technologies described in Patent Document 2 provide higher insulation reliability than those in Patent Document 1 because of the reduced exposure of the conductive material. Furthermore, since increasing the conductive material content does not raise the risk of short-circuiting between the conductive particles, these technologies make the device discharge faster, i.e., reduce the peak voltage of the device, by allowing for the use of more conductive material.

However, the technologies described in Patent Document 2 also have unresolved problems, including the following.

As can be seen from paragraphs [0034] and [0094] and FIG. 4 of Patent Document 2, "a conductive material coated with an inorganic material" in the technologies described in Patent Document 2 is obtained simply by coating the surface of the conductive material with fine particles of the inorganic material. By these technologies, therefore, it is relatively difficult to cover the entire surface of the conductive material with the inorganic material. This problem remains even if the surface of the conductive material is completely covered with the inorganic material before firing; as illustrated in FIG. 12, firing can make the conductive material 1 expand and no longer completely covered with the inorganic material 2, i.e., firing can make the conductive material 1 exposed. These technologies therefore need further improvement in terms of insulation reliability.

Patent Document 1: Japanese Unexamined Patent Application Publication No. 2008-85284

Patent Document 2: International Publication No. 2009/098944

BRIEF SUMMARY OF THE INVENTION

An object of this invention is therefore to provide an ESD protection device that can solve such problems, i.e., that provides highly reliable insulation and has good discharge characteristics, and a method for producing such an ESD protection device.

This invention is first directed to an ESD protection device. The ESD protection device has opposing first and second discharge electrodes, an auxiliary electrode for accelerated discharge astride between the first and second discharge electrodes, and an insulating substrate that supports the first and second discharge electrodes and the auxiliary electrode. To solve the technical problems described above, the auxiliary electrode is composed of an assembly of core-shell metal particles that have a core portion mainly composed of a first metal and a shell portion mainly composed of at least one metal oxide that contains a second metal.

The metal particles in the auxiliary electrode are completely or almost completely covered with the shell portion mainly composed of the at least one metal oxide. This improves the reliability of the device in terms of insulation against discharge.

Preferably, the metal particles have a bond with each other with a vitreous substance therebetween. This would limit the reduction of peak voltage characteristics in the event of a drop impact.

The at least one metal oxide that contains the second metal may contain an amorphous form of the at least one metal oxide. This allows the metal particles to have a bond with each other with a vitreous substance derived from the shell portion therebetween and, as a result, would limit the reduction of peak voltage characteristics in the event of a drop impact as in the above case.

The thickness of the shell portion is preferably in the range of 100 to 350 nm. This provides not only high insulation reliability but also good discharge characteristics, in particular, a lowered peak voltage.

In a preferred embodiment, the second metal is more easily oxidized than the first metal so that the core-shell metal particles that have the core portion mainly composed of the first metal and the shell portion mainly composed of the metal oxide that contains the second metal can be easily obtained by using the production method described below.

In the above embodiment, it is preferred that the first metal is copper or a copper alloy, i.e., an alloy the main component of which is copper, so that the ESD protection device can be provided at relatively low cost. Furthermore, the relatively high melting point of copper makes the device more reliable in terms of insulation against discharge. Particles of a low-melting metal can be melted and sintered by the heat generated during discharge and cause short-circuiting.

In the above embodiment, it is also preferred that the at least one metal oxide that contains the second metal is selected from aluminum oxide, silicon oxide, magnesium oxide, and nickel oxide. These highly insulating oxides make the device more reliable in terms of insulation against discharge.

The core portion may contain the second metal as a minor component in addition to the first metal. Even if the shell portion breaks for any reason, adding the second metal to the core portion allows the shell portion to restore its shape upon exposure to the heat generated during discharge.

Preferably, the ESD protection device according to this invention satisfies the following: the first and second discharge electrodes and the auxiliary electrode are located in the insulating substrate; the insulating substrate has a cavity in which the gap between the first and second discharge electrodes is located; and first and second outer terminal electrodes are on the surface of the insulating substrate and are electrically coupled to the first and second discharge electrodes, respectively. This improves the humidity resistance of the ESD protection device.

This invention is also directed to a method for producing an ESD protection device.

The method for producing an ESD protection device according to this invention includes providing an alloy powder made of an alloy that contains a first metal and a second metal that is more easily oxidized than the first metal, providing an insulating substrate, forming an unfired auxiliary electrode for accelerated discharge on the surface or in the inside of the insulating substrate, the unfired auxiliary electrode containing the alloy powder, forming first and second discharge electrodes on the surface or in the inside of the insulating substrate, the first and second discharge electrodes facing each other on the auxiliary electrode, and firing the unfired auxiliary electrode in an atmosphere in which the oxygen concentration is such that the first metal is not oxidized whereas the second metal is oxidized. The firing step includes forming a shell portion around each metal particle in the alloy powder from a metal oxide that contains the second metal by moving the second metal toward the surface of the metal particle and oxidizing the second metal on the surface of the metal particle to form the metal oxide.

It does not matter whether the auxiliary electrode or the first and second discharge electrodes are formed first.

The alloy powder is preferably prepared by atomization. Atomization allows for easy control of the composition of the alloy. The inventor has found that the thickness of the shell portion formed in the firing step from the metal oxide that contains the second metal can be controlled by changing the proportions of the first and second metals in the alloy. In addition to this, the inventor has found that the thickness of the shell portion formed from the metal oxide that contains the second metal can also be controlled by changing the diameter of the metal particles in the alloy powder.

The above-described preferred structure, in which metal particles have a bond with each other with a vitreous substance therebetween, can be obtained by carrying out the method for producing an ESD protection device according to this invention in the following ways.

A first method is used when the insulating substrate contains a vitreous substance. In this method, the step of providing the insulating substrate includes providing an unfired insulating substrate that contains at least a material that forms a vitreous substance when fired, and during the firing step this unfired insulating substrate is sintered and the vitreous substance is formed so that the metal particles are bonded with the formed vitreous substance.

A feature of a second method is that the unfired auxiliary electrode already contains glass, and this method includes providing a vitreous substance. In this method, the unfired auxiliary electrode formed on the surface or in the inside of the insulating substrate additionally contains the vitreous substance, and during the firing step the metal particles are bonded with this vitreous substance.

A third method features a material that is contained in the unfired auxiliary electrode and forms glass when fired. This method includes providing a glass precursor, i.e., a material that forms glass when fired. In this method, the unfired auxiliary electrode formed on the surface or in the inside of the insulating substrate additionally contains the glass precursor, and during the firing step glass is formed from the glass precursor so that the metal particles are bonded with the formed glass.

A feature of a fourth method is that glass is formed during firing by a reaction that involves the shell portion. This method includes providing at least one glass-forming substance, i.e., a material or materials that form glass by reacting with the shell portion of the metal particles when fired, selected from oxides, alkali metal salts, and alkaline-earth metal salts. In this method, the unfired auxiliary electrode formed on the surface or in the inside of the insulating substrate additionally contains the at least one glass-forming substance, and during the firing step the shell portion of the metal particles and the at least one glass-forming substance are allowed to react to form glass so that the metal particles are bonded with the formed glass.

A fifth method features a separate glass layer that supplies glass to the auxiliary electrode. This method includes forming a glass layer that contains at least a material that forms a vitreous substance when fired, and the formed glass layer is in contact with the unfired auxiliary electrode. During the firing step of this method, the metal particles are bonded with the vitreous substance formed in the glass layer.

In a preferred embodiment of the method for producing an ESD protection device according to this invention, the step of providing the insulating substrate includes providing a plurality of ceramic green sheets that include first and second ceramic green sheets. In this embodiment, the unfired auxiliary electrode and the first and second discharge electrodes are formed on the first ceramic green sheet. This preferred embodiment also includes forming a vanishing layer that covers the gap between the first and second discharge electrodes, covering the unfired auxiliary electrode, the first and second discharge electrodes, and the vanishing layer on the first ceramic green sheet with the second ceramic green sheet to obtain an unfired insulating substrate, and forming first and second outer terminal electrodes on the surface of the insulating substrate in such a manner that the first and second outer terminal electrodes are electrically coupled to the first and second discharge electrodes, respectively. During the firing step of this method, the ceramic green sheets are sintered to form the insulating substrate, and the vanishing layer is burnt out.

The ESD protection device according to this invention provides highly reliable insulation against discharge because even repeated application of electrostatic discharge does not greatly affect the characteristics of the device. Furthermore, it is possible to make the device discharge faster, i.e., reduce the peak voltage of the device, by increasing the amount of metal particles because increasing the metal particle content does not raise the risk of short-circuiting between the metal particles. The ESD protection device according to this invention can therefore be used to protect semiconductor devices and many other kinds of equipment and apparatuses.

The method for producing an ESD protection device according to this invention includes firing metal particles in an alloy powder in an atmosphere in which the oxygen concentration is such that a first metal is not oxidized whereas a second metal is oxidized, and during this firing step the second metal is oxidized after appearing on the surface of the metal particles. This method is therefore an easy way to make the metal particles completely or almost completely covered with a shell portion mainly composed of a metal oxide.

DETAILED DESCRIPTION OF THE INVENTION

Figure 1:
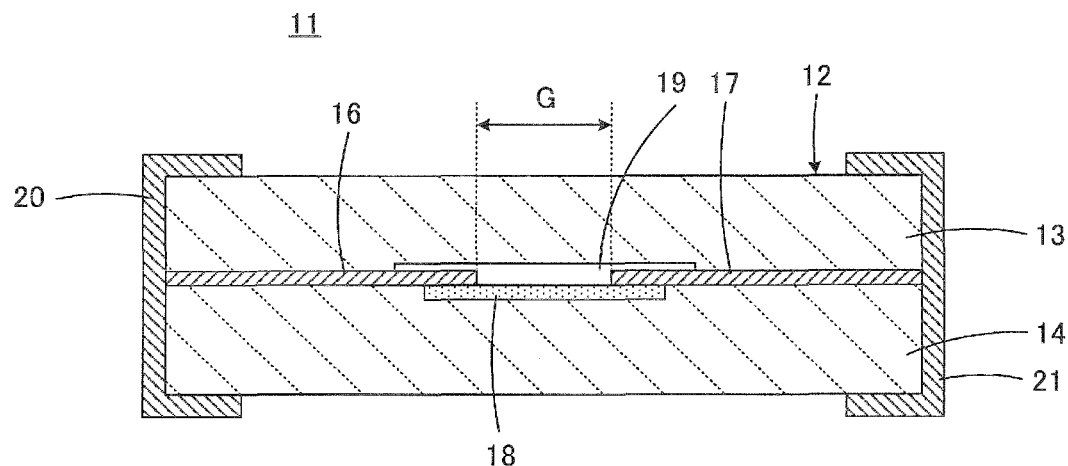
FIG. 1 is a cross-sectional view of an ESD protection device 11 according to Embodiment 1 of the invention.

The following illustrate an ESD protection device 11 according to Embodiment 1 of the invention with reference to FIG. 1.

The ESD protection device 11 has an insulating substrate 12. Examples of materials that can be used to make the insulating substrate 12 include low-temperature co-fired ceramics (LTCC) such as glass ceramics, high-temperature co-fired ceramics (HTCC) such as aluminum nitride and alumina, and magnetic ceramics such as ferrite. The insulating substrate 12 has a laminated structure including at least an upper layer portion 13 and a lower layer portion 14.

The insulating substrate 12 contains some components between the upper layer portion 13 and the lower layer portion 14: first and second discharge electrodes 16 and 17 that face each other with a predetermined gap G therebetween, and an auxiliary electrode for accelerated discharge 18 astride between the first and second discharge electrodes 16 and 17. The portion of the insulating substrate 12 where the gap G exists is referred to as a cavity 19.

First and second outer terminal electrodes 20 and 21 are formed on the outer surface of the insulating substrate 12. The first and second outer terminal electrodes 20 and 21 are electrically coupled to the first and second discharge electrodes 16 and 17, respectively.

Figure 2:
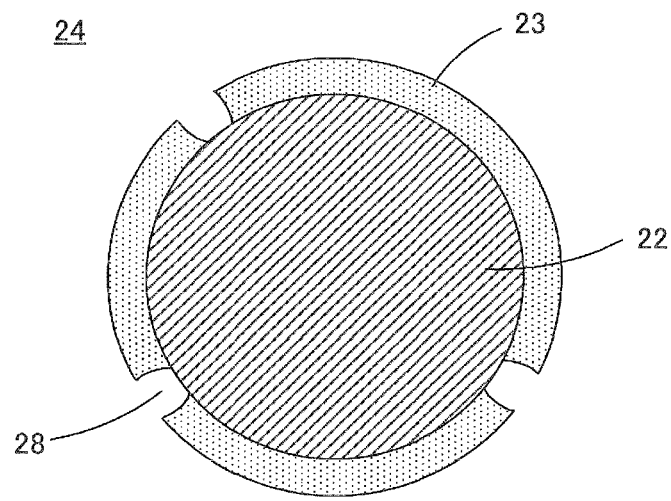
FIG. 2 is a schematic cross-sectional view of a metal particle 24 in a particle assembly that serves as the auxiliary electrode for accelerated discharge 18 in FIG. 1.

In such an ESD protection device 11, the auxiliary electrode for accelerated discharge 18 is composed of an assembly of core-shell metal particles 24 that have a core portion 22 and mainly composed of a first metal and a shell portion 23 mainly composed of at least one metal oxide that contains a second metal as illustrated in FIG. 2. The metal particles 24 in the auxiliary electrode 18 are completely or almost completely covered with the shell portion 23 mainly composed of the at least one metal oxide in a core-shell structure, and this improves the reliability of the device in terms of insulation against discharge. Note that the shell portion 23 is not an assembly of fine particles, but is like a coating as illustrated in FIG. 2.

As illustrated in FIG. 2, each metal particle 24 may have a small area that is not covered with the shell portion 23 mainly composed of the at least one metal oxide, i.e., defective portions 23, unless the insulation reliability is not substantially affected. The achievement of the core-shell structure in this invention is defined as the condition where the ratio L2/L1 is 75% or more, where L1 is the total circumferential length of the core portion 22 of the metal particle 24 and L2 is the circumferential length excluding the defective portions 28, i.e., where the core portion 22 is covered with the shell portion 23.

Although the metal particles 24 in FIG. 2 and FIG. 4 (described hereinafter) has a roughly circular cross-section, the surface of the core portion 22 is actually more complicated and uneven as a result of a step of firing an unfired auxiliary electrode in the production method described below.

As can be seen from Experiments below, the thickness of the shell portion is preferably in the range of 100 to 350 nm. This provides not only high insulation reliability but also good discharge characteristics, in particular, a lowered peak voltage. Probably, the shell portion provides limited insulation when having a thickness of less than 100 nm because the insulation coating is too thin to protect the entire shell portion from the impact that occurs when ESD is applied or because the first metal component in the core portion can diffuse into the shell portion. It also appears that when the thickness of the shell portion is more than 350 nm, the insulation coating is so thick that only limited surface creepage occurs when ESD is applied.

The use of the second metal that is more easily oxidized than the first metal is an easy way to obtain the core-shell metal particles 24 that have the core portion 22 mainly composed of the first metal and the shell portion 23 mainly composed of the at least one metal oxide that contains the second metal by using the production method described below.

The first metal can be, for example, copper or a copper alloy, i.e., an alloy the main component of which is copper. When the first metal is copper or a copper alloy, the second metal can be, for example, aluminum, nickel, bismuth, gallium, germanium, indium, magnesium, phosphorus, silicon, or tin. When the first metal is a copper or a copper-based metal and the auxiliary electrode 18 and the insulation substrate 12 are co-fired, the insulating substrate 12 is preferably made of an LTCC material.

Other metals such as silver, aluminum, molybdenum, and tungsten can also be used as the first metal. The second metal can be any metal that is more easily oxidized than the first metal, regardless of what the first metal is.

The second metal is selected as being more easily oxidized than the first metal in this way. The at least one metal oxide that contains the second metal is preferably selected from, among others, aluminum oxide, silicon oxide, magnesium oxide, and nickel oxide. These highly insulating oxides make the device more reliable in terms of insulation against discharge.

A typical process for producing the ESD protection device 11 is as follows.

First, ceramic green sheets that form the insulating substrate 12 are provided. The ceramic green sheets include a first ceramic green sheet that forms, in a typical assignment, the lower layer portion 14 of the insulating substrate 12 and a second ceramic green sheet that forms, in a typical assignment, the upper layer portion 13.

Separately, an alloy powder is provided. The alloy powder is to form the auxiliary electrode for accelerated discharge 18 and is made from an alloy that contains a first metal and a second metal that is more easily oxidized than the first metal. This alloy powder is preferably prepared by atomization. Atomization allows for easy control of the composition of the alloy. The use of an alloy powder prepared by atomization provides a high packing density of metal particles in the auxiliary electrode 18.

Then a paste that contains the alloy powder is applied to the first ceramic green sheet to form an unfired paste coating, which is to form the auxiliary electrode 18, in a predetermined pattern. This paste for forming the auxiliary electrode 18 may contain additional components such as SiC as long as the desired characteristics are obtained.

Then the first and second discharge electrodes 16 and 17 are formed on the first ceramic green sheet, facing each other on the paste coating, i.e., an unfired form of the auxiliary electrode 18, with a predetermined gap G therebetween. The discharge electrodes 16 and 17 are formed by application of a conductive paste, for example.

Then a vanishing layer is formed to cover the gap G between the first and second discharge electrodes 16 and 17. The vanishing layer is burnt out during a firing step (described hereinafter), leaving the cavity 19 in the insulating substrate 12. An example of a material that can be used to form the vanishing layer is a paste that contains plastic beads.

The pastes used to form the auxiliary electrode 18, the first and second discharge electrodes 16 and 17, and the vanishing layer may be applied directly to the specified base or by other techniques such as transfer printing.

Then the second ceramic green sheet is placed on and pressed against the first ceramic green sheet to cover the unfired form of the auxiliary electrode 18, the first and second discharge electrodes 16 and 17, and the vanishing layer. In this way, an unfired form of the insulating substrate 12 is obtained.

Then first and second outer external electrodes 20 and 21 are formed on the surface of the unfired form of the insulating substrate 12. The outer terminal electrodes 20 and 21 are formed by application of a conductive paste, for example.

Then the obtained structure is fired in an atmosphere having the oxygen concentration at which the first metal in the alloy powder in the unfired form of the auxiliary electrode 18 is not oxidized whereas the second metal is oxidized.

During this firing step the ceramic green sheets are sintered, forming the insulating substrate 12, and the discharge electrodes 16 and 17, auxiliary electrode 18, and outer terminal electrodes 20 and 21 are also sintered.

Figure 3:
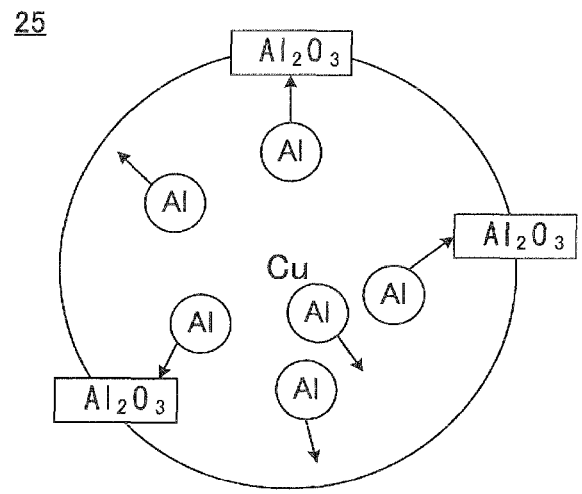
FIG. 3 is a schematic cross-sectional view of a metal particle 25, a precursor form of the metal particle 24 in FIG. 2, illustrating the movement of Al, the second metal, during the firing step.

During the firing step, each metal particle in the alloy metal contained in the auxiliary electrode 18 exhibits a phenomenon that is described below with reference to FIG. 3, where the first and second metals of the alloy are Cu and Al, respectively. FIG. 3 illustrates one metal particle 25 in the alloy powder.

In the metal particle 25 composed of Cu and Al, Al moves toward the surface of the metal particle 25 with the progress of firing as indicated by arrows. Al then reaches the surface and turns into $Al_2O_3$ as a result of oxidation; the shell portion of the metal particle 25 is formed from $Al_2O_3$. Such a phenomenon naturally suggests that Al, the second metal, may remain in the core portion of the metal particle 25.

As mentioned above, the composition of the alloy can be easily controlled by preparing the alloy powder by atomization. In relation to this, the inventor has found that the thickness of the shell portion formed in the firing step from the metal oxide that contains the second metal can be controlled by changing the proportions of the first and second metals in the alloy. Therefore some measures, such as controlling the proportions of the first and second metals, can be taken so that the shell portion can have a preferred thickness, such as a thickness that falls within the range specified above, 100 to 350 nm. The inventor has also found that the thickness of the shell portion formed from the metal oxide that contains the second metal can also be controlled by changing the diameter of the metal particle 25.

During the firing step the vanishing layer is burnt out, and a cavity 19 is formed in the insulating substrate 12.

In this way, the ESD protection device 11 is completed.

Figure 4:
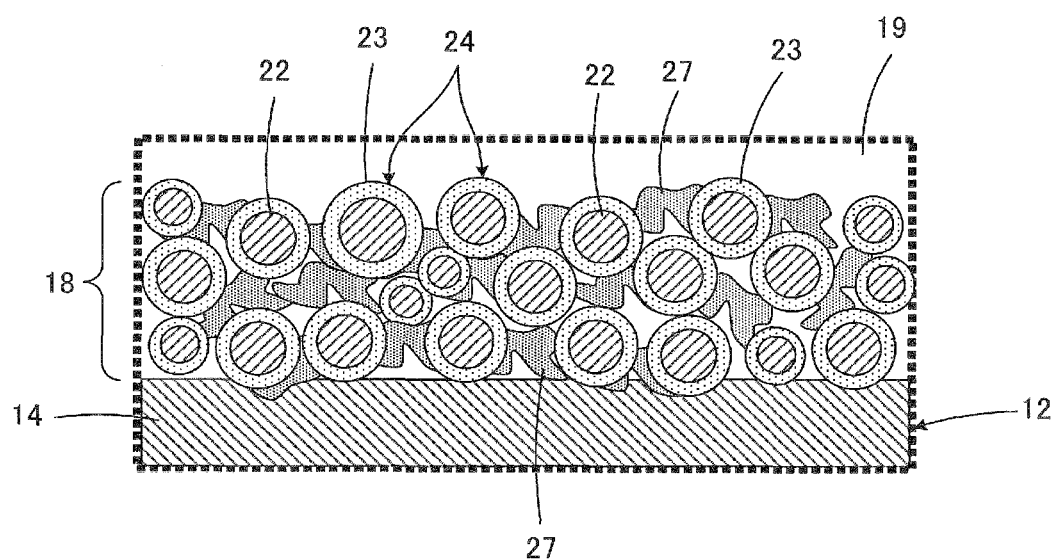
FIG. 4 is an enlarged schematic cross-sectional view of the auxiliary electrode 18 in FIG. 1.

The structure of the auxiliary electrode 18 of this ESD protection device 11 is preferably as illustrated in FIG. 4. In FIG. 4, the auxiliary electrode 18 is in contact with the lower layer portion 14 of the insulating substrate 12, and the auxiliary electrode 18 is composed of an assembly of core-shell metal particles 24 that has a core portion 22 and a shell portion 23.

As illustrated in FIG. 4, the metal particles 24 in the auxiliary electrode 18 have a bond with each other with a vitreous substance 27 therebetween. This would limit the reduction of peak voltage characteristics in the event of a drop impact. Such a structure, in which the metal particles 24 have a bond with each other with the vitreous substance 27 therebetween, can be obtained by producing the ESD protection device 1 by any of the following methods. It is also possible to carry out two or more of these methods in combination.

A first method is used when the insulating substrate 12 contains a vitreous substance, e.g., when it is made of a glass ceramic material or any other low-temperature co-fired ceramic (LTCC) material. In this method, the step of providing the insulating substrate 12 includes providing an unfired form of the insulating substrate 12, the unfired substrate containing at least a material that forms the vitreous substance 27 when fired, and during the firing step this unfired form of the insulating substrate 12 is sintered and the vitreous substance 27 is formed. The formed vitreous substance 27 diffuses into the auxiliary electrode 18 during the firing step, bonding the metal particles 24 together.

A second method is used when the unfired form of the auxiliary electrode 18 already contains glass, and this method includes providing a vitreous substance. In this method, the paste used to form the unfired form of the auxiliary electrode 18 contains the vitreous substance, and during the firing step the vitreous substance flows in the paste and provides the state where the metal particles 24 have a bond with each other with the vitreous substance 27 therebetween. Examples of materials that can be used as the vitreous substance include $SiO_2$—$B_2O_3$—CaO glass, $SiO_2$—$B_2O_3$—$Li_2O$ glass, and $SiO_2$—$B_2O_3$—$Al_2O_3$—$Li_2O$—CaO glass.

A third method is used when the unfired form of the auxiliary electrode 18 already contains a material that forms glass when fired. This method includes providing a glass precursor, i.e., a material that forms glass when fired. The paste used in this method to form the unfired form of the auxiliary electrode 18 additionally contains the glass precursor, and during the firing step glass is formed from the glass precursor so that the metal particles 24 are bonded with the formed glass. Examples of materials that can be used as the glass precursor include $SiO_2$—BaO—$Al_2O_3$—MnO ceramics.

A fourth method is used when glass is formed during firing by a reaction that involves the shell portion 23. This method includes providing at least one glass-forming substance, i.e., a material or materials that form glass by reacting with the shell portion 23 of the metal particles 24 when fired, selected from oxides, alkali metal salts, and alkaline-earth metal salts. The paste used in this method to form the unfired form of the auxiliary electrode 18 additionally contains the at least one glass-forming substance, and during the firing step the shell portion 23 of the metal particles 24 and the at least one glass-forming substance are allowed to react to form glass so that the metal particles 24 are bonded with the formed glass. When the metal oxide of which the shell portion 23 is mainly composed is $Al_2O_3$, for example, examples of materials that can be used as the at least one glass-forming substance include oxides such as $Al_2O_3$, $ZrO_2$, $TiO_2$, and ZnO, alkali metal salts such as $Na_2CO_3$ and $Li_2CO_3$, and alkaline-earth metal salts such as $BaCO_3$ and $MgCO_3$.

Figure 5:
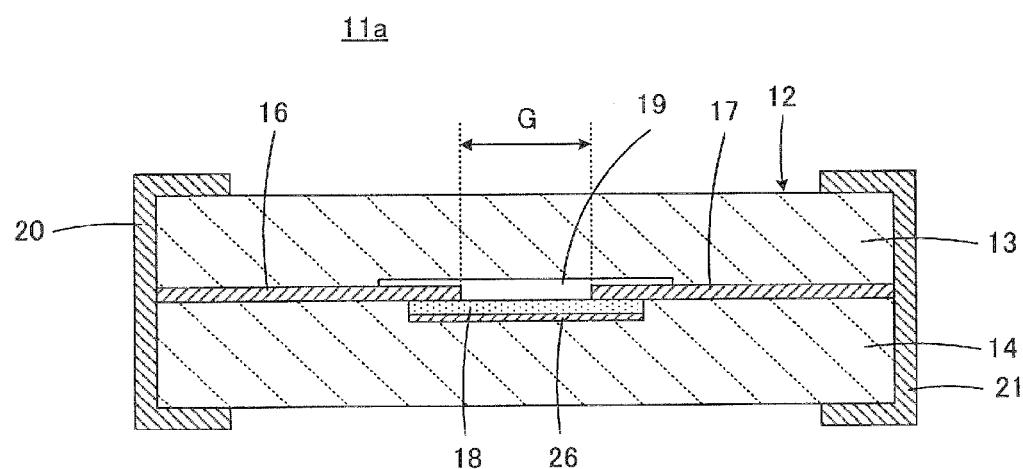
FIG. 5 is a cross-sectional view of an ESD protection device 11a according to Embodiment 2 of the invention. This device was obtained by a preferred form of the production method according to this invention.

A fifth method is used when a separate glass layer is used to supply glass to the auxiliary electrode 18. The following describes this fifth method with reference to FIG. 5. FIG. 5 illustrates an ESD protection device 11a according to Embodiment 2 of the invention, and this device was obtained by the fifth method. Those elements that have an equivalent in FIG. 1 are given the same number in FIG. 5 and are not described in detail in the following.

The ESD protection device 11a in FIG. 5 has a glass layer 26 along the boundary between the auxiliary electrode 18 and the insulating substrate 12. The production of the ESD protection device 11a involves the formation of the glass layer 26 on an unfired form of the auxiliary electrode 18. The glass layer 26 is formed by applying a paste that contains at least a material that forms a vitreous substance when fired. During the firing step, the vitreous substance formed in the glass layer 26 diffuses into the auxiliary electrode 18, and the diffusing vitreous substance bonds the metal particles 24 together. Examples of materials that can be used as the vitreous substance include $SiO_2$—$B_2O$—CaO glass, $SiO_2$—$B_2O_3$—$Li_2O$ glass, and $SiO_2$—$B_2O_3$—$Al_2O_3$—$Li_2O$—CaO glass.

The glass layer 26 may lack a definite shape in the finished ESD protection device 11a as a result of the diffusion of the vitreous substance into the auxiliary electrode 18.

The state where the metal particles 24 have a bond with each other with a vitreous substance therebetween can also be attained without these methods. One such case is where the oxide that contains the second metal, i.e., the main component of the shell portion 23, becomes partially amorphous. For example, when the shell portion 23 is mainly composed of $Al_2O_3$, some amount of $Al_2O_3$ can turn amorphous. In this case, the metal particles 24 are bonded with a vitreous substance derived from the shell portion 23.

Modifications are also possible within the scope of the invention, including the following.

The discharge electrodes 16 and 17 and the auxiliary electrode 18, which are located in the insulating substrate 12 in the illustrated embodiments, may be located on the outer surface of the insulating substrate.

The cavity 19 is not an essential element, even when the discharge electrodes 16 and 17 and the auxiliary electrode 18 are located in the insulating substrate 12.

The simultaneous firing in the production method described above, i.e., sintering the discharge electrodes 16 and 17 and the auxiliary electrode 18 and the insulating substrate 12 at once, can also be changed; it is possible to provide a sintered ceramic insulating substrate and form the discharge electrodes and the auxiliary electrode on this insulating substrate.

The following describes some experiments conducted to demonstrate the advantages of this invention.

Experiment 1

Preparation of Test Samples (1) Ceramic Green Sheets

Ceramic materials mainly composed of Ba, Al, and Si were mixed in predetermined proportions, and the mixture was calcined at 800° C. to 1000° C. The calcined powder was ground in a zirconia ball mill for 12 hours.

The obtained ceramic powder was blended with organic solvents including toluene and EKINEN. Then the mixture was blended with a binder and a plasticizer to form slurry.

The obtained slurry was shaped with a doctor blade into 50-μm-thick ceramic green sheets. One of the ceramic green sheets is the ceramic green sheet 31 in FIGS. 6 to 10, and another is the ceramic green sheet 36 in FIGS. 9 and 10.

(2) Auxiliary Electrode Pastes (2)-1. Metal Powders

For use in pastes for forming the auxiliary electrode for accelerated discharge, metal powders M-1 to M-19 in Table 1 were prepared by atomization. The values in "Particle size distribution", "Specific gravity", and "Composition" in Table 1 were determined by laser diffraction particle size analysis, gas-phase substitution, and ICP-AES (inductively coupled plasma atomic emission spectroscopy), respectively.

TABLE 1

| Metal | | Composition (mol %) | | | | | Particle size distribution (μm) | | | Specific |
| code | Metal | Cu | Al | Si | Mg | Ni | D10 | D50 | D90 | gravity |
| --- | --- | --- | --- | --- | --- | --- | --- | --- | --- | --- |
| M-1 | Cu—Al alloy | 85 | 15 | — | — | — | 0.7 | 1.2 | 3.5 | 7.8 |
| M-2 | Cu—Al alloy | 85 | 15 | — | — | — | 1.3 | 2.5 | 5.0 | 7.8 |
| M-3 | Cu—Al alloy | 85 | 15 | — | — | — | 2.1 | 4.0 | 7.4 | 7.8 |
| M-4 | Cu—Al alloy | 83 | 17 | — | — | — | 1.9 | 2.6 | 5.5 | 7.5 |

TABLE 1-continued

| Metal code | Metal | Composition (mol %) | | | | | Particle size distribution (μm) | | | Specific gravity |
|---|---|---|---|---|---|---|---|---|---|---|
| | | Cu | Al | Si | Mg | Ni | D10 | D50 | D90 | |
| M-5 | Cu—Al alloy | 67 | 33 | — | — | — | 1.5 | 2.7 | 5.9 | 6.3 |
| M-6 | Cu—Al alloy | 46 | 54 | — | — | — | 1.7 | 2.4 | 5.5 | 5.0 |
| M-7 | Cu—Al alloy | 40 | 60 | — | — | — | 0.9 | 1.3 | 3.7 | 4.8 |
| M-8 | Cu—Al alloy | 40 | 60 | — | — | — | 1.5 | 2.9 | 5.8 | 4.8 |
| M-9 | Cu—Al alloy | 40 | 60 | — | — | — | 1.9 | 3.9 | 7.2 | 4.8 |
| M-10 | Cu—Si alloy | 86 | — | 14 | — | — | 0.7 | 1.2 | 3.4 | 7.5 |
| M-11 | Cu—Si alloy | 86 | — | 14 | — | — | 1.4 | 2.5 | 5.3 | 7.5 |
| M-12 | Cu—Si alloy | 86 | — | 14 | — | — | 2.5 | 3.5 | 6.8 | 7.5 |
| M-13 | Cu—Mg alloy | 87 | — | — | 13 | — | 0.8 | 1.3 | 3.3 | 7.3 |
| M-14 | Cu—Mg alloy | 87 | — | — | 13 | — | 1.6 | 3.1 | 5.5 | 7.3 |
| M-15 | Cu—Mg alloy | 87 | — | — | 13 | — | 2.1 | 3.6 | 7.0 | 7.3 |
| M-16 | Cu—Ni alloy | 77 | — | — | — | 23 | 0.9 | 1.5 | 3.6 | 8.9 |
| M-17 | Cu—Ni alloy | 77 | — | — | — | 23 | 1.5 | 2.5 | 5.5 | 8.9 |
| M-18 | Cu—Ni alloy | 77 | — | — | — | 23 | 1.9 | 3.8 | 6.9 | 8.9 |
| M-19 | Cu | 100 | — | — | — | — | 1.5 | 2.8 | 5.5 | 8.9 |

(2)-2. Glass Powders

For optional use in the pastes for forming the auxiliary electrode, glass powders G-1 to G-7 in Table 2 were prepared. The values in "Ts" and "SSA" in Table 2 are the softening point and the specific surface area of the glass, which were measured by differential thermal analysis and gas adsorption, respectively. The values in "Particle size distribution" were determined by a method similar to that for the metal powders.

TABLE 2

| Glass code | Glass | Ts (°C.) | Particle size distribution (μm) D50 | SSA (m²/g) |
|---|---|---|---|---|
| G-1 | SiO$_2$—B$_2$O$_3$—CaO | 980 ± 10° C. | 0.5 | 16.0 |
| G-2 | SiO$_2$—B$_2$O$_3$—CaO | 980 ± 10° C. | 1.6 | 4.4 |
| G-3 | SiO$_2$—B$_2$O$_3$—CaO | 980 ± 10° C. | 2.5 | 2.8 |
| G-4 | SiO$_2$—B$_2$O$_3$—Li$_2$O | 780 ± 20° C. | 1.2 | 12.0 |
| G-5 | SiO$_2$—B$_2$O$_3$—Al$_2$O$_3$—Li$_2$O—CaO | 760 ± 20° C. | 0.5 | 18.0 |
| G-6 | SiO$_2$—B$_2$O$_3$—Al$_2$O$_3$—Li$_2$O—CaO | 760 ± 20° C. | 1.5 | 5.0 |
| G-7 | SiO$_2$—B$_2$O$_3$—Al$_2$O$_3$—Li$_2$O—CaO | 760 ± 20° C. | 2.5 | 2.5 |

(2)-3. Glass Precursor Powders

For optional use in the pastes for forming the auxiliary electrode, glass precursor powders C-1 and C-2 in Table 3 were prepared. More specifically, glass precursor powders were prepared by calcining SiO$_2$—BaO—Al$_2$O$_3$—MnO ceramic powders with a specific surface area in "SSA" in Table 3 at a temperature of 720° C. to 780° C. The specific surface area of the calcined glass precursor powders is presented in "SSA after calcination" in Table 3. The values in "SSA" were determined by a method similar to that for the glass powders.

TABLE 3

| Glass precursor code | Glass precursor | SSA (m²/g) | SSA after calcination (m²/g) |
|---|---|---|---|
| C-1 | SiO$_2$—BaO—Al$_2$O$_3$—MnO | 12.3 | 6.3 |
| C-2 | SiO$_2$—BaO—Al$_2$O$_3$—MnO | 28.1 | 9.6 |

The potential of glass precursor powders C-1 and C-2 to form glass was studied by firing green compacts made from these glass precursor powders using the same firing profile as in the firing step described below and then observing a cross-section of the sintered compacts by TEM (transmission electron microscopy) and analyzing it by electron diffraction and EDS (energy-dispersive X-ray spectroscopy). The sintered compacts were found to contain a crystalline component and a glass component, and the glass component was a glass that contained SiO$_2$, BaO, Al$_2$O$_3$, and MnO.

(2)-4. Oxide Powders

For optional use in the pastes for forming the auxiliary electrode, oxide powders O-1 to O-6 in Table 4 were prepared. The values in "Particle size distribution" and "SSA" in Table 4 were determined by a method similar to that for the metal powders and a method similar to that for the glass powders, respectively.

TABLE 4

| Oxide code | Oxide | Particle size distribution (μm) D50 | SSA (m²/g) |
|---|---|---|---|
| O-1 | Al$_2$O$_3$ | 0.02 | 55.8 |
| O-2 | Al$_2$O$_3$ | 0.5 | 9.2 |
| O-3 | Al$_2$O$_3$ | 3.0 | 2.8 |
| O-4 | ZrO$_2$ | 0.5 | 13.1 |

TABLE 4-continued

| Oxide code | Oxide | Particle size distribution (μm) D50 | SSA ($m^2/g$) |
|---|---|---|---|
| O-5 | $TiO_2$ | 0.5 | 10.1 |
| O-6 | ZnO | 0.5 | 9.5 |

(2)-5. Alkali Metal Salt/Alkaline-Earth Metal Salt Powders

For optional use in the pastes for forming the auxiliary electrode, alkali metal salt and alkaline-earth metal salt powders R-1 to R-4 in Table 5 were prepared. The values in "Particle size distribution" in Table 5 were determined by a method similar to that for the metal powders.

TABLE 5

| Metal salt | Alkali metal salt or alkaline-earth metal salt | Particle size distribution (μm) D50 |
|---|---|---|
| R-1 | $BaCO_3$ | 1.3 |
| R-2 | $MgCO_3$ | 0.9 |
| R-3 | $Na_2CO_3$ | 1.5 |
| R-4 | $Li_2CO_3$ | 1.2 |

(2)-6. Organic Vehicle

For use as a dispersion medium for the metal powder and other components in the pastes for forming the auxiliary electrode, an organic vehicle was prepared by dissolving ETHOCEL resin with a weight-average molecular weight of $5 \times 10^4$ and an alkyd with a weight-average molecular weight of $8 \times 10^3$ in terpineol. The organic vehicle was composed of 9.0% by weight ETHOCEL, 4.5% by weight alkyd, and 86.5% by weight terpineol.

(2)-7. Dispersion

The metal powders were mixed with the organic vehicle and optionally with a glass powder, a glass precursor powder, an oxide powder, or an alkali metal salt/alkaline-earth metal salt powder in the volume proportions given in Tables 6 to 9. The mixtures were subjected to dispersion in a three-roll mill to form auxiliary electrode pastes P-1 to P-58. The following describes auxiliary electrode pastes P-1 to P-58 in more detail in groups according to formula.

Auxiliary electrode pastes P-1 to P-19 were each obtained by dispersing one of metal powders M-1 to M-19 in Table 1 in the organic vehicle, as presented in Table 6.

TABLE 6

| Paste code | Metal | Metal powder (volume %) | Organic vehicle (volume %) |
|---|---|---|---|
| P-1 | M-1 | 14.0 | 86.0 |
| P-2 | M-2 | 14.0 | 86.0 |
| P-3 | M-3 | 14.0 | 86.0 |
| P-4 | M-4 | 14.0 | 86.0 |
| P-5 | M-5 | 14.0 | 86.0 |
| P-6 | M-6 | 14.0 | 86.0 |
| P-7 | M-7 | 14.0 | 86.0 |
| P-8 | M-8 | 14.0 | 86.0 |
| P-9 | M-9 | 14.0 | 86.0 |
| P-10 | M-10 | 14.0 | 86.0 |
| P-11 | M-11 | 14.0 | 86.0 |
| P-12 | M-12 | 14.0 | 86.0 |
| P-13 | M-13 | 14.0 | 86.0 |
| P-14 | M-14 | 14.0 | 86.0 |
| P-15 | M-15 | 14.0 | 86.0 |
| P-16 | M-16 | 14.0 | 86.0 |
| P-17 | M-17 | 14.0 | 86.0 |
| P-18 | M-18 | 14.0 | 86.0 |
| P-19 | M-19 | 14.0 | 86.0 |

Auxiliary electrode pastes P-20 to P-33 were each obtained by dispersing metal powder M-2 in Table 1 and one of glass powders G-1 to G-7 in Table 2 in the organic vehicle, as presented in Table 7.

TABLE 7

| Paste code | Metal (volume %) M-2 | Glass (volume %) G-1 | G-2 | G-3 | G-4 | G-5 | G-6 | G-7 | Organic vehicle (volume %) |
|---|---|---|---|---|---|---|---|---|---|
| P-20 | 12.6 | 1.4 | — | — | — | — | — | — | 86.0 |
| P-21 | 8.4 | 5.6 | — | — | — | — | — | — | 86.0 |
| P-22 | 12.6 | — | 1.4 | — | — | — | — | — | 86.0 |
| P-23 | 8.4 | — | 5.6 | — | — | — | — | — | 86.0 |
| P-24 | 12.6 | — | — | 1.4 | — | — | — | — | 86.0 |
| P-25 | 8.4 | — | — | 5.6 | — | — | — | — | 86.0 |
| P-26 | 12.6 | — | — | — | 1.4 | — | — | — | 86.0 |
| P-27 | 11.4 | — | — | — | 4.2 | — | — | — | 86.0 |
| P-28 | 12.6 | — | — | — | — | 1.4 | — | — | 86.0 |
| P-29 | 11.4 | — | — | — | — | 4.2 | — | — | 86.0 |
| P-30 | 12.6 | — | — | — | — | — | 1.4 | — | 86.0 |
| P-31 | 11.4 | — | — | — | — | — | 4.2 | — | 86.0 |
| P-32 | 12.6 | — | — | — | — | — | — | 1.4 | 86.0 |
| P-33 | 11.4 | — | — | — | — | — | — | 4.2 | 86.0 |

Auxiliary electrode pastes P-34 to P-37 were each obtained by dispersing metal powder M-2 in Table 1 and one of glass precursor powders C-1 and C-2 in Table 3 in the organic vehicle, as presented in Table 8.

TABLE 8

| Paste code | Metal (volume %) M-2 | Glass precursor (volume %) C-1 | C-2 | Organic vehicle (volume %) |
|---|---|---|---|---|
| P-34 | 13.7 | 0.3 | — | 86.0 |
| P-35 | 8.4 | 5.6 | — | 86.0 |
| P-36 | 13.7 | — | 0.3 | 86.0 |
| P-37 | 8.4 | — | 5.6 | 86.0 |

Figure 7:
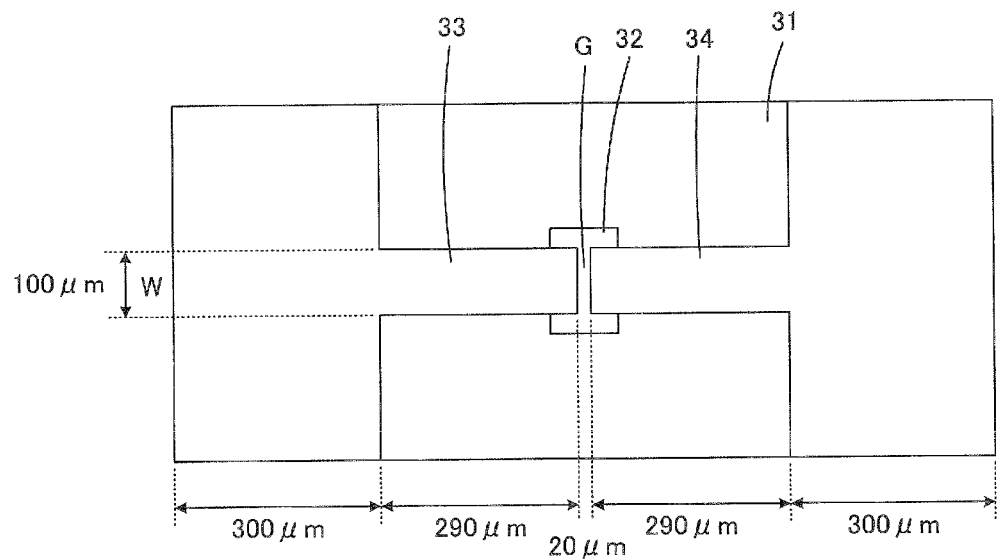
FIG. 7 is a plan view for illustrating the process of the production of the ESD protection device 42 produced in the experiment. After the step in FIG. 6, unfired first and second discharge electrodes 33 and 34 were formed.

Auxiliary electrode pastes P-38 to P-58 were each obtained by dispersing metal powder M-2 in Table 1 and either one of oxide powders O-1 to O-6 in Table 4 or one of alkali metal salt/alkaline-earth metal salt powders R-1 to R-4 in Table 5 in the organic vehicle, as presented in Table 9.

first and second discharge electrodes 33 and 34 that partially covered the unfired auxiliary electrode 32 as illustrated in FIG. 7. The unfired first and second discharge electrodes 33 and 34 were positioned opposite each other on the unfired auxiliary electrode 32 with a gap G of 20 μm therebetween,

TABLE 9

| Paste code | Metal (volume %) | Oxide, alkali metal salt, or alkaline-earth metal salt (volume %) | | | | | | | | | | Organic vehicle (volume %) |
|---|---|---|---|---|---|---|---|---|---|---|---|---|
| | M-2 | O-1 | O-2 | O-3 | O-4 | O-5 | O-6 | R-1 | R-2 | R-3 | R-4 | |
| P-38 | 13.7 | 0.3 | — | — | — | — | — | — | — | — | — | 86.0 |
| P-39 | 8.4 | 5.6 | — | — | — | — | — | — | — | — | — | 86.0 |
| P-41 | 13.7 | — | 0.3 | — | — | — | — | — | — | — | — | 86.0 |
| P-42 | 8.4 | — | 5.6 | — | — | — | — | — | — | — | — | 86.0 |
| P-43 | 13.7 | — | — | 0.3 | — | — | — | — | — | — | — | 86.0 |
| P-44 | 8.4 | — | — | 5.6 | — | — | — | — | — | — | — | 86.0 |
| P-45 | 13.7 | — | — | — | 0.3 | — | — | — | — | — | — | 86.0 |
| P-46 | 8.4 | — | — | — | 5.6 | — | — | — | — | — | — | 86.0 |
| P-47 | 13.7 | — | — | — | — | 0.3 | — | — | — | — | — | 86.0 |
| P-48 | 8.4 | — | — | — | — | 5.6 | — | — | — | — | — | 86.0 |
| P-49 | 13.7 | — | — | — | — | — | 0.3 | — | — | — | — | 86.0 |
| P-50 | 8.4 | — | — | — | — | — | 5.6 | — | — | — | — | 86.0 |
| P-51 | 13.7 | — | — | — | — | — | — | 0.3 | — | — | — | 86.0 |
| P-52 | 8.4 | — | — | — | — | — | — | 5.6 | — | — | — | 86.0 |
| P-53 | 13.7 | — | — | — | — | — | — | — | 0.3 | — | — | 86.0 |
| P-54 | 8.4 | — | — | — | — | — | — | — | 5.6 | — | — | 86.0 |
| P-55 | 13.7 | — | — | — | — | — | — | — | — | 0.3 | — | 86.0 |
| P-56 | 8.4 | — | — | — | — | — | — | — | — | 5.6 | — | 86.0 |
| P-57 | 13.7 | — | — | — | — | — | — | — | — | — | 0.3 | 86.0 |
| P-58 | 8.4 | — | — | — | — | — | — | — | — | — | 5.6 | 86.0 |

(3) Discharge Electrode Paste

A mixture of 40% by weight Cu powder with an average particle diameter of 1 μm, 40% by weight Cu powder with an average particle diameter of 3 μm, and 20% by weight organic vehicle was blended in a three-roll mill. The organic vehicle was prepared by dissolving ethylcellulose in terpineol. The obtained paste was used to form the discharge electrodes.

(4) Plastic-Bead-Containing Paste for Forming the Vanishing Layer

A plastic-bead-containing paste for forming the vanishing layer, i.e., a layer that was to be burnt out and leave a cavity during firing, was prepared. A mixture of 38% by weight crosslinked acrylic beads with an average particle diameter of 1 μm and 62% by weight organic vehicle was blended in a three-roll mill. The organic vehicle was prepared by dissolving ethylcellulose in dihydroterpinyl acetate. The obtained plastic-bead-containing paste was used to form the vanishing layer.

(5) Outer Terminal Electrode Paste

A mixture of 80% by weight Cu powder with an average particle diameter of about 1 μm, 5% by weight alkali borosilicate glass frit with a transition point of 620° C., a softening point of 720° C., and an average particle diameter of about 1 μm, and 20% by weight organic vehicle was blended in a three-roll mill. The organic vehicle was prepared by dissolving ethylcellulose in terpineol. The obtained paste was used to form the outer terminal electrodes.

(6) Printing of the Pastes

Figure 6:
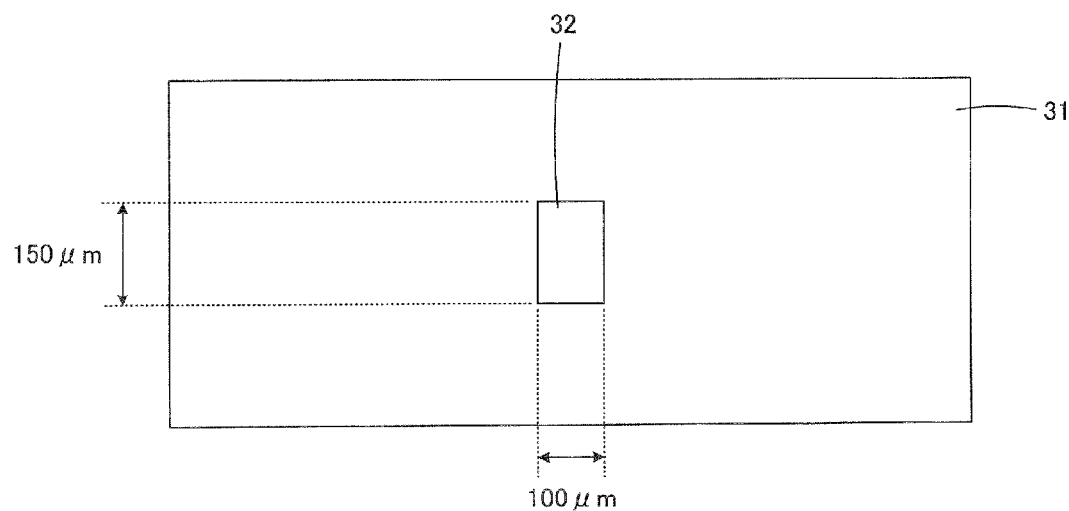
FIG. 6 is a plan view for illustrating the process of the production of an ESD protection device 42 produced in an experiment. An unfired auxiliary electrode for accelerated discharge 32 was formed on a first ceramic green sheet 31.

First, the auxiliary electrode paste was applied to one main surface of a ceramic green sheet 31 to form a 150 μm×100 μm unfired auxiliary electrode for accelerated discharge 32 as illustrated in FIG. 6. The auxiliary electrode paste was one of auxiliary electrode pastes P-1 to P-58 and was chosen as shown in "Auxiliary electrode paste code" in Tables 10, 11, and 12.

Then the discharge electrode paste was applied to the same main surface of the ceramic green sheet 31 to form unfired first and second discharge electrodes 33 and 34 that partially covered the unfired auxiliary electrode 32 as illustrated in FIG. 7. The unfired first and second discharge electrodes 33 and 34 were positioned opposite each other on the unfired auxiliary electrode 32 with a gap G of 20 μm therebetween, and the width W of these electrodes was 100 μm in the region where they faced each other. Other dimension parameters are also given in FIG. 7.

Figure 8:
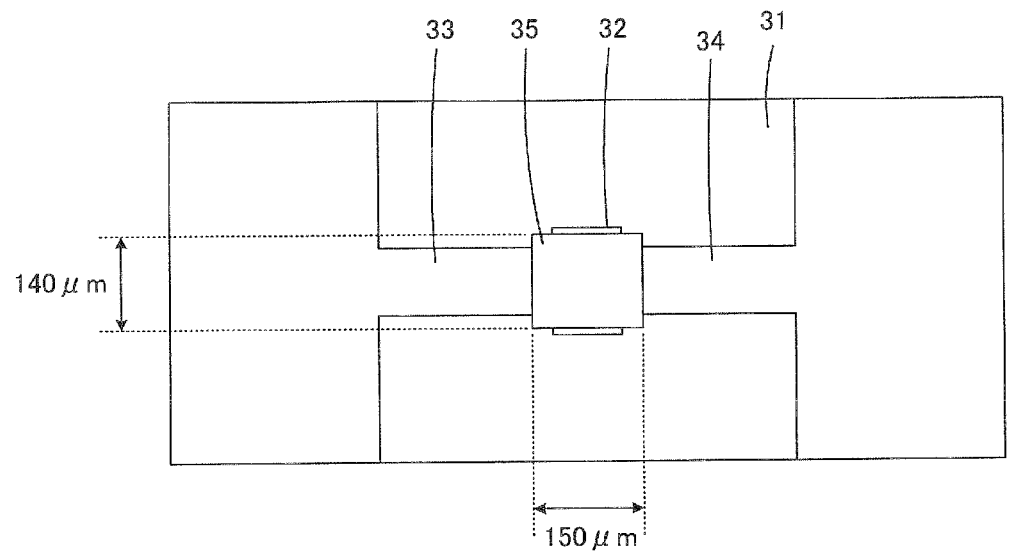
FIG. 8 is a plan view for illustrating the process of the production of the ESD protection device 42 produced in the experiment. After the step in FIG. 7, an unfired vanishing layer 35 was formed.

The plastic-bead-containing paste for forming the vanishing layer was then applied to cover the gap G between the unfired first and second discharge electrodes 33 and 34 to form a 140 μm×150 μm unfired vanishing layer 35 as illustrated in FIG. 8.

(7) Stacking and Compression

Figure 9:
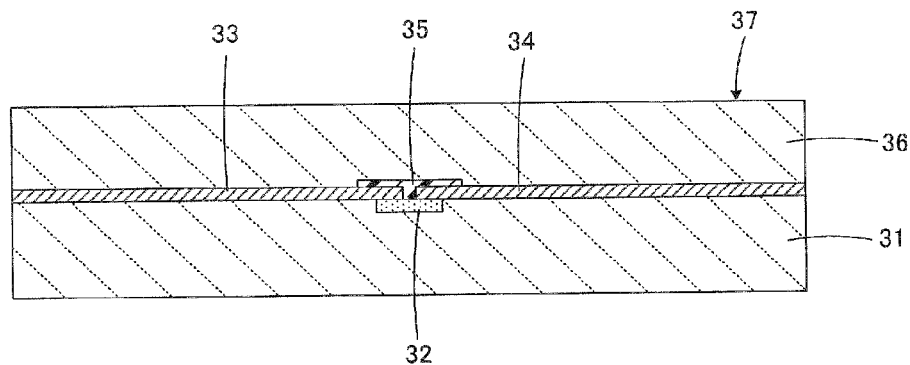
FIG. 9 is a plan view for illustrating the process of the production of the ESD protection device 42 produced in the experiment. After the step in FIG. 8, a second ceramic green sheet 36 was placed.

After the unfired auxiliary electrode 32, the unfired discharge electrodes 33 and 34, and the unfired vanishing layer 35 were formed on one main surface of the first ceramic green sheet 31 as described above, several second ceramic green sheets 36, to which no paste was applied, were placed on and pressed against the same main surface to form an unfired insulating substrate 37 as illustrated in FIG. 9. This insulating substrate 37 was designed so that its thickness would be 0.3 mm after firing.

(8) Cutting and Outer Electrode Paste Printing

The insulating substrate 37 was cut with a microcutter into a size that would be planar dimensions of 1.0 mm×0.5 mm after firing. The dimension parameters in FIG. 7 and the outer shape of the ceramic green sheet 31 and other elements in FIGS. 6 to 9 should be understood as being those after this cutting step.

Figure 10:
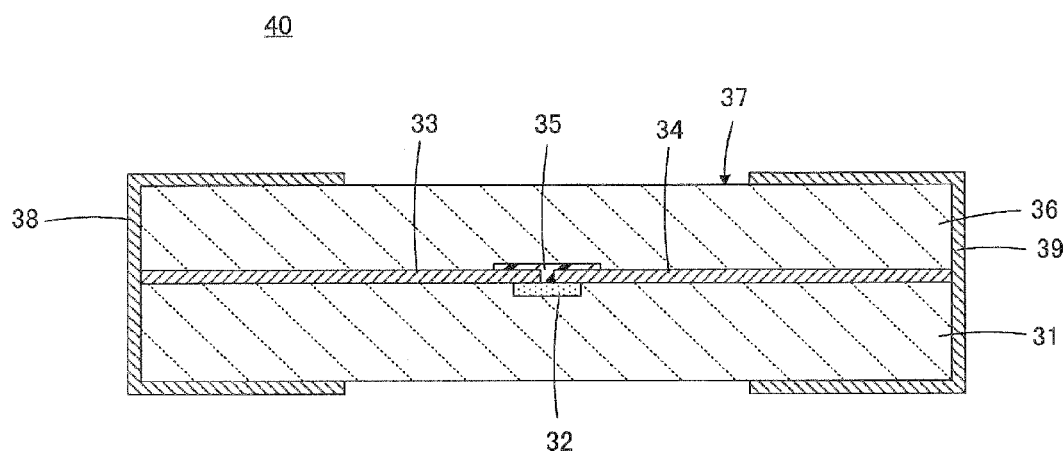
FIG. 10 is a plan view for illustrating the process of the production of the ESD protection device 42 produced in the experiment. After the step in FIG. 9, unfired outer terminal electrodes 38 and 39 were formed.

Then as illustrated in FIG. 10, the outer electrode paste was applied to the outer surface of the insulating substrate 37 to form unfired first and second outer terminal electrodes 38 and 39, which were to be coupled to the first and second discharge electrodes 33 and 34, respectively. An unfired ESD protection device 40 was obtained in this way.

(9) Firing

Figure 11:
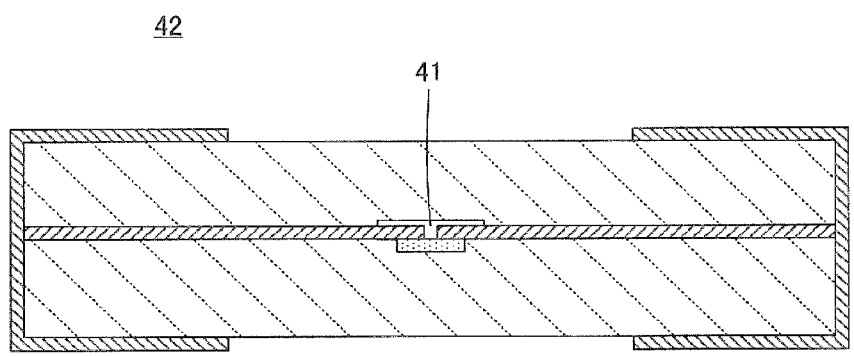
FIG. 11 is a cross-sectional view of the finished ESD protection device 42 in the experiment. The step in FIG. 10 was followed by firing.
Figure 12:
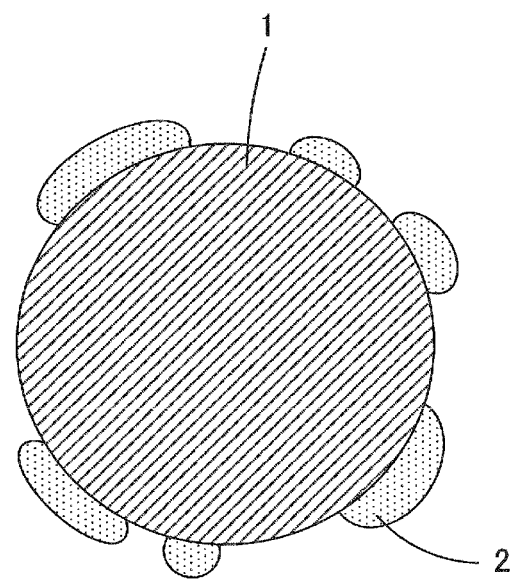
FIG. 12 is a schematic cross-sectional view for illustrating a potential problem with the technologies described in Patent Document 2, showing a conductive material 1 and an inorganic material 2 after firing.

The unfired ESD protection device 40 was fired at temperatures up to a maximum in the range of 980° C. to 1000° C., giving an ESD protection device 42 that had a cavity 41 as illustrated in FIG. 11.

The atmosphere in the furnace during firing was controlled using $N_2$, $H_2$, and $H_2O$ to make the firing condition one of the following three conditions A, B, and C with different oxygen concentrations. The firing condition was chosen as shown in "Firing condition" in Tables 10 to 12.

Firing Condition A

The oxygen concentration was such that copper would not be oxidized whereas aluminum, silicon, magnesium, and nickel would be oxidized.

Firing Condition B

The oxygen concentration was such that copper and nickel would not be oxidized whereas aluminum, silicon, and magnesium would be oxidized.

Firing Condition C

The oxygen concentration was such that copper, aluminum, silicon, magnesium, and nickel would be oxidized.

The partial pressure of oxygen required for the oxidation of these metals at a temperature T (K) was calculated using the following formulae.

$$\ln(Cu_{PO2}) > \{-338904 + (-33T \log T) + 247T\}/(8.314T)$$

$$\ln(Al_{PO2}) > \{-1117993 + (-11T \log T) + 244T\}/(8.314T)$$

$$\ln(Si_{PO2}) > \{-881150 + (-13T \log T) + 218T\}/(8.314T)$$

$$\ln(Mg_{PO2}) > \{-1207921 + (-25T \log T) + 284T\}/(8.314T)$$

$$\ln(Ni_{PO2}) > \{--489110 + 197T\}/(8.314T)$$

Characterization

The prepared samples of ESD protection devices were characterized by the methods described below.

(1) Structure of the Metal Particles in the Auxiliary Electrode

Each ESD protection device was embedded in epoxy resin, and the resin was cured. The cured article was polished to expose an LT plane, i.e., a plane defined by the longitudinal sides and the sides extending in the direction of thickness, until half the width dimension was removed. The auxiliary electrode exposed by polishing was processed by the FIB (focused ion beam) technique. A test specimen sampled from the auxiliary electrode by the FIB process was then observed by TEM (transmission electron microscopy) and analyzed by EDS (energy-dispersive X-ray spectroscopy) for metal species and oxygen assays. The results of the TEM observation and the ESD analysis were used to determine whether the metal particles in the auxiliary electrode had a core-shell structure with a shell portion made of a metal oxide.

The evaluations ○ and x in "Core-shell structure" in Tables 10 to 12 mean that a metal-oxide shell portion was observed and that a metal-oxide shell portion was not observed, respectively. As mentioned above with reference to FIG. 2, the criteria for judging between ○ and x for "Core-shell structure" were as follows: ○, the ratio L2/L1 was 75% or more, where L1 is the total circumferential length of the core portion of a metal particle and L2 is the circumferential length excluding defective portions, i.e., the length where the core portion was covered with the shell portion; x, the ratio L2/L1 was less than 75%.

The samples in which the metal particles had a metal-oxide shell portion were further analyzed to identify the metal oxide and subjected to imaging for the calculation of the thickness of the shell portion. Tables 10 to 12 present the results in "Metal oxide" and "Thickness" under "Shell portion".

(2) Binding with a Vitreous Substance

A study was conducted on the samples that received ○ for "Core-shell structure" to determine whether the metal particles in the auxiliary electrode had a bond with each other with a vitreous substance therebetween. More specifically, the interfacial space between the shell portion of a selected core-shell particle and that of the next metal particle was analyzed using an electron diffractometer, and samples were judged to contain a vitreous substance between metal particles when no electron diffraction pattern was observed. The evaluations ○ and x in "Bonding with a vitreous substance" in Tables 10 to 12 mean that the metal particles had bonds with a vitreous substance therebetween and that they had no such bonds, respectively.

(3) Initial Short-Circuiting

A direct voltage of 50 V was applied across the outer terminal electrodes of each sample of an ESD protection device, and the insulation resistance was measured. Samples were judged to have good initial short-circuiting characteristics when the insulation resistance was $10^8 \Omega$ or more. The evaluations ○ and x in "Initial short-circuiting" in Tables 10 to 12 mean that the initial short-circuiting characteristics were good in that way and that the insulation resistance was less than $10^8 \Omega$ and the initial short-circuiting characteristics were poor, respectively.

The ESD protection devices found to have poor initial short-circuiting characteristics were determined to be useless and excluded from the subsequent characterization studies (short-circuit resistance, peak voltage, and peak voltage after a drop impact).

(4) Short-Circuit Resistance

Each sample of an ESD protection device was subjected to the following sequence of voltage application steps: 0.2 kV, 10 times; 0.4 kV, 10 times; 0.6 kV, 10 times; 1 kV, 10 times; 2 kV, 10 times; then 4 kV, 10 times. The insulation resistance of the sample was measured during each instance of voltage application, and samples were judged to have excellent short-circuit resistance when the measured resistance had never fallen below $10^8 \Omega$. The evaluations ⊙, ○, and x in "Short-circuit resistance" in Tables 10 to 12 mean that the short-circuit resistance was excellent in that way, that the measured resistance had fallen into the range of $10^6 \Omega$ to less than $10^8 \Omega$ at least once and the short-circuit resistance was good, and that the measured resistance had fallen below $10^6 \Omega$ at least once and the short-circuit resistance was poor, respectively.

(5) Peak Voltage

Each sample of an ESD protection device was subjected to an electrostatic discharge of 8 kV using an electrostatic discharge gun while the voltage was measured using an oscilloscope. The measured voltage was defined as peak voltage (Vpeak1), and samples were judged to have excellent peak voltage characteristics when the peak voltage (Vpeak1) was less than 400 V. The evaluations ⊙, ○, and x in "Peak voltage" in Tables 10 to 12 mean that the peak voltage characteristics were excellent in that way, that the peak voltage (Vpeak1) was in the range of 400 V to less than 700 V and the peak voltage characteristics were good, and that the peak voltage (Vpeak1) was 700 V or more and the peak voltage characteristics were poor, respectively.

(6) Peak Voltage after a Drop Impact

Each sample of an ESD protection device was dropped vertically from a height of 1.8 m 50 times. Then as in the measurement of peak voltage (Vpeak1) described above, the ESD protection device was subjected to an electrostatic discharge of 8 kV using an electrostatic discharge gun while the voltage was measured using an oscilloscope. The measured voltage was defined as peak voltage after a drop impact (Vpeak2).

Samples were judged to have excellent peak voltage characteristics after a drop impact when the ratio of Vpeak2 to Vpeak1, i.e., Vpeak2/Vpeak1, was in the following range: 1.00≤Vpeak2/Vpeak1≤1.25. The evaluations ⊙, ○, and x in "Peak voltage after a drop impact" in Tables 10 to 12 mean that the peak voltage characteristics after a drop impact were excellent in that way, that 1.25<Vpeak2/Vpeak1≤1.50 and the peak voltage characteristics were good after the drop impact, and that Vpeak2/Vpeak1>1.50 and the peak voltage characteristics deteriorated because of the drop impact, respectively.

(7) Overall Evaluation

The evaluations ⊙, ○, and x in "Overall evaluation" in Tables 10 to 12 mean that the sample received ⊙ for all of "Short-circuit resistance", "Peak voltage", and "Peak voltage after a drop impact", that the sample received ⊙ and ○ for these parameters, and that the sample was given x for "Initial short-circuiting".

TABLE 10

| | | | | Characteristics | | | | | | |
|---|---|---|---|---|---|---|---|---|---|---|
| | Auxiliary | | | Shell portion | | Binding with | Initial | Short- | | Peak voltage | |
| Sample No. | electrode paste code | Firing condition | Core-shell structure | Metal oxide | Thickness (μm) | a vitreous substance | short-circuiting | circuit resistance | Peak voltage | after a drop impact | Overall evaluation |
| 1 | P-1 | A | ○ | Al₂O₃ | 70 | ○ | ○ | ○ | ○ | ⊙ | ○ |
| 2 | P-2 | A | ○ | Al₂O₃ | 180 | ○ | ○ | ⊙ | ⊙ | ⊙ | ⊙ |
| 3 | P-3 | A | ○ | Al₂O₃ | 200 | ○ | ○ | ⊙ | ⊙ | ⊙ | ⊙ |
| 4 | P-4 | A | ○ | Al₂O₃ | 200 | ○ | ○ | ⊙ | ⊙ | ⊙ | ⊙ |
| 5 | P-5 | A | ○ | Al₂O₃ | 350 | ○ | ○ | ⊙ | ⊙ | ⊙ | ⊙ |
| 6 | P-6 | A | ○ | Al₂O₃ | 500 | ○ | ○ | ⊙ | ○ | ⊙ | ○ |
| 7 | P-7 | A | ○ | Al₂O₃ | 200 | ○ | ○ | ⊙ | ⊙ | ⊙ | ⊙ |
| 8 | P-8 | A | ○ | Al₂O₃ | 550 | ○ | ○ | ⊙ | ○ | ⊙ | ○ |
| 9 | P-9 | A | ○ | Al₂O₃ | 700 | ○ | ○ | ⊙ | ○ | ⊙ | ○ |
| 10 | P-10 | A | ○ | SiO₂ | 100 | ○ | ○ | ⊙ | ⊙ | ⊙ | ⊙ |
| 11 | P-11 | A | ○ | SiO₂ | 150 | ○ | ○ | ⊙ | ⊙ | ⊙ | ⊙ |
| 12 | P-12 | A | ○ | SiO₂ | 300 | ○ | ○ | ⊙ | ⊙ | ⊙ | ⊙ |
| 13 | P-13 | A | ○ | MgO | 100 | ○ | ○ | ⊙ | ⊙ | ⊙ | ⊙ |
| 14 | P-14 | A | ○ | MgO | 150 | ○ | ○ | ⊙ | ⊙ | ⊙ | ⊙ |
| 15 | P-15 | A | ○ | MgO | 300 | ○ | ○ | ⊙ | ⊙ | ⊙ | ⊙ |
| 16 | P-16 | A | ○ | NiO | 30 | ○ | ○ | ○ | ○ | ⊙ | ○ |
| 17 | P-17 | A | ○ | NiO | 70 | ○ | ○ | ○ | ○ | ⊙ | ○ |
| 18 | P-18 | A | ○ | NiO | 100 | ○ | ○ | ⊙ | ⊙ | ⊙ | ⊙ |
| *19 | P-19 | A | X | — | — | — | X | — | — | — | X |
| *20 | P-16 | B | X | — | — | — | X | — | — | — | X |
| *21 | P-17 | B | X | — | — | — | X | — | — | — | X |
| *22 | P-18 | B | X | — | — | — | X | — | — | — | X |
| *23 | P-2 | C | X | — | — | — | X | — | — | — | X |
| *24 | P-10 | C | X | — | — | — | X | — | — | — | X |
| *25 | P-13 | C | X | — | — | — | X | — | — | — | X |
| *26 | P-16 | C | X | — | — | — | X | — | — | — | X |

TABLE 11

| | | | | Characteristics | | | | | | |
|---|---|---|---|---|---|---|---|---|---|---|
| | Auxiliary | | | Shell portion | | Binding with | Initial | Short- | | Peak voltage | |
| Sample No. | electrode paste code | Firing condition | Core-shell structure | Metal oxide | Thickness (μm) | a vitreous substance | short-circuiting | circuit resistance | Peak voltage | after a drop impact | Overall evaluation |
| 27 | P-20 | B | ○ | Al₂O₃ | 180 | ○ | ○ | ⊙ | ⊙ | ⊙ | ⊙ |
| 28 | P-21 | A | ○ | Al₂O₃ | 180 | ○ | ○ | ⊙ | ⊙ | ⊙ | ⊙ |
| 29 | P-22 | A | ○ | Al₂O₃ | 180 | ○ | ○ | ⊙ | ⊙ | ⊙ | ⊙ |
| 30 | P-23 | A | ○ | Al₂O₃ | 180 | ○ | ○ | ⊙ | ⊙ | ⊙ | ⊙ |
| 31 | P-24 | A | ○ | Al₂O₃ | 180 | ○ | ○ | ⊙ | ⊙ | ⊙ | ⊙ |
| 32 | P-25 | A | ○ | Al₂O₃ | 180 | ○ | ○ | ⊙ | ⊙ | ⊙ | ⊙ |
| 33 | P-26 | A | ○ | Al₂O₃ | 180 | ○ | ○ | ⊙ | ⊙ | ⊙ | ⊙ |
| 34 | P-27 | A | ○ | Al₂O₃ | 180 | ○ | ○ | ⊙ | ⊙ | ⊙ | ⊙ |
| 35 | P-28 | A | ○ | Al₂O₃ | 180 | ○ | ○ | ⊙ | ⊙ | ⊙ | ⊙ |
| 36 | P-29 | A | ○ | Al₂O₃ | 180 | ○ | ○ | ⊙ | ⊙ | ⊙ | ⊙ |
| 37 | P-30 | A | ○ | Al₂O₃ | 180 | ○ | ○ | ⊙ | ⊙ | ⊙ | ⊙ |
| 38 | P-31 | A | ○ | Al₂O₃ | 180 | ○ | ○ | ⊙ | ⊙ | ⊙ | ⊙ |
| 39 | P-32 | A | ○ | Al₂O₃ | 180 | ○ | ○ | ⊙ | ⊙ | ⊙ | ⊙ |
| 40 | P-33 | A | ○ | Al₂O₃ | 180 | ○ | ○ | ⊙ | ⊙ | ⊙ | ⊙ |
| 41 | P-34 | A | ○ | Al₂O₃ | 180 | ○ | ○ | ⊙ | ⊙ | ⊙ | ⊙ |

TABLE 11-continued

| | | | | | | Characteristics | | | | | |
|---|---|---|---|---|---|---|---|---|---|---|---|
| | Auxiliary | | | Shell portion | | Binding with | Initial | Short- | | Peak voltage | |
| Sample No. | electrode paste code | Firing condition | Core-shell structure | Metal oxide | Thickness (μm) | a vitreous substance | short-circuiting | circuit resistance | Peak voltage | after a drop impact | Overall evaluation |
| 42 | P-34 | B | ○ | Al₂O₃ | 180 | ○ | ○ | ⊙ | ⊙ | ⊙ | ⊙ |
| 43 | P-35 | A | ○ | Al₂O₃ | 180 | ○ | ○ | ⊙ | ⊙ | ⊙ | ⊙ |
| 44 | P-36 | A | ○ | Al₂O₃ | 180 | ○ | ○ | ⊙ | ⊙ | ⊙ | ⊙ |
| 45 | P-37 | A | ○ | Al₂O₃ | 180 | ○ | ○ | ⊙ | ⊙ | ⊙ | ⊙ |

TABLE 12

| | | | | | | Characteristics | | | | | |
|---|---|---|---|---|---|---|---|---|---|---|---|
| | Auxiliary | | | Shell portion | | Binding with | Initial | Short- | | Peak voltage | |
| Sample No. | electrode paste code | Firing condition | Core-shell structure | Metal oxide | Thickness (μm) | a vitreous substance | short-circuiting | circuit resistance | Peak voltage | after a drop impact | Overall evaluation |
| 46 | P-38 | A | ○ | Al₂O₃ | 180 | ○ | ○ | ⊙ | ⊙ | ⊙ | ⊙ |
| 47 | P-38 | B | ○ | Al₂O₃ | 180 | ○ | ○ | ⊙ | ⊙ | ⊙ | ⊙ |
| 48 | P-39 | A | ○ | Al₂O₃ | 180 | ○ | ○ | ⊙ | ⊙ | ⊙ | ⊙ |
| 49 | P-41 | A | ○ | Al₂O₃ | 180 | ○ | ○ | ⊙ | ⊙ | ⊙ | ⊙ |
| 50 | P-42 | A | ○ | Al₂O₃ | 180 | ○ | ○ | ⊙ | ⊙ | ⊙ | ⊙ |
| 51 | P-43 | A | ○ | Al₂O₃ | 180 | ○ | ○ | ⊙ | ⊙ | ⊙ | ⊙ |
| 52 | P-44 | A | ○ | Al₂O₃ | 180 | ○ | ○ | ⊙ | ⊙ | ⊙ | ⊙ |
| 53 | P-45 | A | ○ | Al₂O₃ | 180 | ○ | ○ | ⊙ | ⊙ | ⊙ | ⊙ |
| 54 | P-46 | A | ○ | Al₂O₃ | 180 | ○ | ○ | ⊙ | ⊙ | ⊙ | ⊙ |
| 55 | P-47 | A | ○ | Al₂O₃ | 180 | ○ | ○ | ⊙ | ⊙ | ⊙ | ⊙ |
| 56 | P-48 | A | ○ | Al₂O₃ | 180 | ○ | ○ | ⊙ | ⊙ | ⊙ | ⊙ |
| 57 | P-49 | A | ○ | Al₂O₃ | 180 | ○ | ○ | ⊙ | ⊙ | ⊙ | ⊙ |
| 58 | P-50 | A | ○ | Al₂O₃ | 180 | ○ | ○ | ⊙ | ⊙ | ⊙ | ⊙ |
| 59 | P-51 | A | ○ | Al₂O₃ | 180 | ○ | ○ | ⊙ | ⊙ | ⊙ | ⊙ |
| 60 | P-52 | A | ○ | Al₂O₃ | 180 | ○ | ○ | ⊙ | ⊙ | ⊙ | ⊙ |
| 61 | P-53 | A | ○ | Al₂O₃ | 180 | ○ | ○ | ⊙ | ⊙ | ⊙ | ⊙ |
| 62 | P-54 | A | ○ | Al₂O₃ | 180 | ○ | ○ | ⊙ | ⊙ | ⊙ | ⊙ |
| 63 | P-55 | A | ○ | Al₂O₃ | 180 | ○ | ○ | ⊙ | ⊙ | ⊙ | ⊙ |
| 64 | P-56 | A | ○ | Al₂O₃ | 180 | ○ | ○ | ⊙ | ⊙ | ⊙ | ⊙ |
| 65 | P-57 | A | ○ | Al₂O₃ | 180 | ○ | ○ | ⊙ | ⊙ | ⊙ | ⊙ |
| 66 | P-58 | A | ○ | Al₂O₃ | 180 | ○ | ○ | ⊙ | ⊙ | ⊙ | ⊙ |

In Table 10, the symbol * before the sample number denotes that the sample was outside the scope of this invention.

The ESD protection devices of samples 1 to 18 and 27 to 58, which were in the scope of this invention and in which the auxiliary electrode for accelerated discharge contained core-shell metal particles that had a metal-oxide shell portion and the core-shell metal particles had a bond with each other with a vitreous substance therebetween, were given ⊙ for the peak voltage characteristics after a drop impact.

In particular, the ESD protection devices of samples 2 to 5, 7, 10 to 15, 18, and 27 to 58, in which the shell portion of the core-shell metal particles in the auxiliary electrode had a thickness of 100 to 350 nm, also received ⊙ for short-circuit resistance and peak discharge characteristics.

The ESD protection device of sample 19, which was outside the scope of this invention, was given x for initial short-circuiting characteristics. This is because the auxiliary electrode paste for this sample was P-19. As shown in Table 6, this P-19 paste contained M-19, which contained a copper powder rather than an alloy powder. As a result, the metal particles in the auxiliary electrode did not have a core-shell structure with a metal-oxide shell portion.

The ESD protection devices of samples 20 to 22, which were outside the scope of this invention, also received x for initial short-circuiting characteristics because of the lack of the core-shell structure with a metal-oxide shell portion in the metal particles in the auxiliary electrode. This appears to be because the oxygen concentration during firing was such that Cu and Ni were reduced and no NiO shell portion was formed.

The ESD protection devices of samples 23 to 26, which were outside the scope of this invention, also received x for initial short-circuiting characteristics because of the lack of the core-shell structure with a metal-oxide shell portion in the metal particles in the auxiliary electrode. This appears to be because the oxygen concentration during firing was such that Cu was oxidized and the metal particles lost much of their conductivity.

Experiment 2

Experiment 2 was conducted to demonstrate that forming glass from the glass layer 26 in FIG. 5 above would provide bonds to the metal particles in the auxiliary electrode. Experiment 2 also included comparative examples in which the sample had a layer that corresponded to the glass layer but was free of glass. The glass layer and the layer corresponding to the glass layer are hereinafter collectively referred to as the contact layer because both were used in contact with the auxiliary electrode.

Preparation of Test Samples

Pastes S-1 and S-2 for forming the contact layer were prepared in accordance with the formula in Table 13.

TABLE 13

| Contact layer paste code | Oxide O-2 | Glass G-6 | Organic vehicle (volume %) |
|---|---|---|---|
| S-1 | 20 | — | 80 |
| S-2 | 17 | 3 | 80 |

In Table 13, "O-2" in "Oxide" represents the O-2 oxide in Table 4, and "G-6" in "Glass" represents the G-6 glass in Table 2.

Some samples of ESD protection devices were prepared as in Experiment 1 except that step (6) Printing of the pastes included, before applying the auxiliary electrode paste to one main surface of a ceramic green sheet 31 to form a 150 μm×100 μm unfired auxiliary electrode for accelerated discharge 32, applying the contact layer paste to the same main surface of the ceramic green sheet 31 to form a 150 μm×100 μm unfired contact layer.

Characterization

The prepared samples of ESD protection devices were characterized as in Experiment 1. The results are summarized in Table 14.

TABLE 14

| | | | | Characteristics | | | | | | | |
|---|---|---|---|---|---|---|---|---|---|---|---|
| | Auxiliary | Contact | | | Shel portion | | Binding with | Initial | Short- | | Peak voltage | |
| Sample No. | electrode paste code | layer paste | Firing condition | Core-shell structure | Metal oxide | Thickness (μm) | a vitreous substance | short-circuiting | circuit resistance | Peak voltage | after a drop impact | Overall evaluation |
| 101 | P-10 | S-1 | A | ○ | SiO$_2$ | 100 | ○ | ○ | ⊙ | ⊙ | ⊙ | ⊙ |
| 102 | P-1 | S-1 | A | ○ | Al$_2$O$_3$ | 180 | ○ | ○ | ⊙ | ⊙ | ○ | ○ |
| 103 | P-1 | S-2 | A | ○ | Al$_2$O$_3$ | 180 | ○ | ○ | ⊙ | ⊙ | ⊙ | ⊙ |

The ESD protection device of sample number 101, in which the auxiliary electrode contained core-shell particles that had a metal-oxide shell portion and the core-shell metal particles had a bond with each other with a vitreous substance therebetween as a result of reaction between the shell portion 33 and the oxide (Al$_2$O$_3$) particles in the contact layer, was given ⊙ for the peak voltage characteristics after a drop impact.

The ESD protection device of sample number 102 received ○ for the peak voltage characteristics after a drop impact, although the auxiliary electrode in this device also contained core-shell metal particles that had a metal-oxide shell portion. This is because some amount of Al$_2$O$_3$ in the shell portion became amorphous and the metal particles were bonded with a vitreous substance derived from the shell portion.

The ESD protection device of sample number 103 was given ○ for the peak voltage characteristics after a drop impact. This is because the auxiliary electrode contained core-shell particles that had a metal-oxide shell portion and because glass in the contact layer diffused into the auxiliary electrode and formed a vitreous substance that bonded the core-shell metal particles together.

11, 11a, 42 ESD protection device
12 Insulating substrate
16, 17 Discharge electrode
18 Auxiliary electrode for accelerated discharge
19, 41 Cavity
20, 21 Outer terminal electrode
22 Core portion
23 Shell portion
24, 25 Metal particle
26 Glass layer
27 Vitreous substance
31, 36 Ceramic green sheet
32 Unfired auxiliary electrode
33, 34 Unfired discharge electrode
35 Unfired vanishing layer
37 Unfired insulating substrate
38, 39 Unfired outer terminal electrode
40 Unfired ESD protection device
G Gap

The invention claimed is:

1. An ESD protection device comprising:
    first and second discharge electrodes arranged as facing each other;
    an auxiliary discharge electrode astride between the first and second discharge electrodes, the auxiliary discharge electrode comprising an assembly of a plurality of core-shell metal particles having a core portion including a first metal as a major component and a shell portion including a metal oxide as a major component, the metal oxide containing a second metal; and
    an insulating substrate supporting the first and second discharge electrodes and the auxiliary discharge electrode.

2. The ESD protection device according to claim 1, wherein the assembly of the plurality of metal particles contains a vitreous substance bonding the plurality of metal particles.

3. The ESD protection device according to claim 1, wherein the metal oxide contains an amorphous form of the metal oxide.

4. The ESD protection device according to claim 1, wherein the shell portion has a thickness of 100 to 350 nm.

5. The ESD protection device according to claim 1, wherein the second metal is more easily oxidized than the first metal.

6. The ESD protection device according to claim 5, wherein the first metal is copper or a copper alloy.

7. The ESD protection device according to claim 5, wherein the metal oxide is selected from aluminum oxide, silicon oxide, magnesium oxide, and nickel oxide.

8. The ESD protection device according to claim 5, wherein the core portion contains the second metal as an accessory component.

9. The ESD protection device according to claim 1, wherein the first and second discharge electrodes and the auxiliary discharge electrode are located inside the insulating substrate, the insulating substrate has a cavity in which a gap between the first and second discharge electrodes is located, and the ESD protection device further comprises first and second outer terminal electrodes formed on a surface of the insulating substrate, the first and second outer terminal electrodes electrically being coupled to the first and second discharge electrodes, respectively.

10. A method for producing an ESD protection device, the method comprising:
providing an alloy powder comprising an alloy containing a first metal and a second metal more easily oxidized than the first metal;
providing an insulating substrate;
forming an unfired auxiliary discharge electrode on a surface or in an inside of the insulating substrate, the unfired auxiliary discharge electrode containing the alloy powder;
forming first and second discharge electrodes on the surface or in the inside of the insulating substrate, the first and second discharge electrodes facing each other on the auxiliary discharge electrode; and
firing the unfired auxiliary discharge electrode in an atmosphere having an oxygen concentration at which the first metal is not oxidized whereas the second metal is oxidized,
the firing step comprising forming a shell portion around each of a plurality of metal particles in the alloy powder from a metal oxide containing the second metal by moving the second metal toward a surface of the metal particle and oxidizing the second metal on the surface of the metal particle to form the metal oxide.

11. The method for producing an ESD protection device according to claim 10, wherein the step of providing the alloy powder comprises preparing the alloy powder by atomization.

12. The method for producing an ESD protection device according to claim 10, wherein:
the step of providing the insulating substrate comprises providing an unfired insulating substrate containing at least a material that forms a vitreous substance when fired; and
the firing step comprises sintering the unfired insulating substrate while forming the vitreous substance and bonding the plurality of metal particles with the vitreous substance in the insulating substrate.

13. The method for producing an ESD protection device according to claim 10, the method further comprising
providing a vitreous substance, wherein:
the unfired auxiliary discharge electrode formed on the surface or in the inside of the insulating substrate additionally contains the vitreous substance; and
the firing step comprises bonding the plurality of metal particles with the vitreous substance.

14. The method for producing an ESD protection device according to claim 10, the method further comprising
providing a glass precursor that forms glass when fired, wherein:
the unfired auxiliary discharge electrode formed on the surface or in the inside of the insulating substrate additionally contains the glass precursor; and
the firing step comprises forming glass from the glass precursor and bonding the plurality of metal particles with the glass.

15. The method for producing an ESD protection device according to claim 10, the method further comprising
providing at least one glass-forming substance that forms glass by reacting with the shell portion of each metal particle when fired, the at least one glass-forming substance selected from oxides, alkali metal salts, and alkaline-earth metal salts, wherein:
the unfired auxiliary discharge electrode formed on the surface or in the inside of the insulating substrate additionally contains the at least one glass-forming substance; and
the firing step comprises allowing the shell portion of each metal particle and the at least one glass-forming substance to react to form glass and bonding the plurality of metal particles with the glass formed by the reaction between the shell portion and the at least one glass-forming substance.

16. The method for producing an ESD protection device according to claim 10, the method further comprising
forming a glass layer containing at least a material that forms a vitreous substance when fired, the formed glass layer being in contact with the unfired auxiliary discharge electrode, wherein
the firing step comprises bonding the plurality of metal particles with the vitreous substance formed in the glass layer.

17. The method for producing an ESD protection device according to claim 10, wherein:
the step of providing the insulating substrate comprises providing a plurality of ceramic green sheets including first and second ceramic green sheets;
the steps of forming the unfired auxiliary discharge electrode and the first and second discharge electrodes are performed on the first ceramic green sheet;
the method further comprises:
forming a vanishing layer covering a gap between the first and second discharge electrodes;
covering the unfired auxiliary discharge electrode, the first and second discharge electrodes, and the vanishing layer on the first ceramic green sheet with the second ceramic green sheet to obtain an unfired form of the insulating substrate; and
forming first and second outer terminal electrodes on the surface of the insulating substrate, the first and second outer terminal electrodes being electrically coupled to the first and second discharge electrodes, respectively; and
the firing step comprises sintering the ceramic green sheets to obtain the insulating substrate and burning out the vanishing layer.

* * * * *